US008968030B2

(12) United States Patent
Zhang et al.

(10) Patent No.: US 8,968,030 B2
(45) Date of Patent: Mar. 3, 2015

(54) CHIP CARD HOLDER FOR ELECTRONIC DEVICE

(71) Applicants: Shenzhen Futaihong Precision Industry Co., Ltd., Shenzhen (CN); FIH (Hong Kong) Limited, Kowloon (HK)

(72) Inventors: Xiao Zhang, Shenzhen (CN); Yong-Gang Zhang, Shenzhen (CN); Kuan-Hung Chen, Shindian (TW)

(73) Assignee: Zhongshan Innocloud Intellectual Property Services Co., Ltd., Guangdong (CN)

( * ) Notice: Subject to any disclaimer, the term of this patent is extended or adjusted under 35 U.S.C. 154(b) by 123 days.

(21) Appl. No.: 13/873,228

(22) Filed: Apr. 30, 2013

(65) Prior Publication Data
US 2014/0038445 A1    Feb. 6, 2014

(30) Foreign Application Priority Data

Aug. 6, 2012    (CN) .......................... 2012 1 02767875

(51) Int. Cl.
*H01R 24/00*    (2011.01)
*H05K 5/02*    (2006.01)
*H04M 1/02*    (2006.01)

(52) U.S. Cl.
CPC ............. *H05K 5/0286* (2013.01); *H04M 1/026* (2013.01); *H04M 2250/14* (2013.01)
USPC ........................................................ 439/630

(58) Field of Classification Search
CPC ....... H04B 1/3816; G06K 7/002; G06K 13/08

USPC .................................. 439/630, 631, 634, 159
See application file for complete search history.

(56) References Cited

U.S. PATENT DOCUMENTS

| 5,831,256 | A  | * | 11/1998 | De Larminat et al. ........ 235/486 |
| 5,894,597 | A  | * | 4/1999  | Schwartz et al. ............. 455/558 |
| 5,933,328 | A  | * | 8/1999  | Wallace et al. ............... 361/737 |
| 6,175,505 | B1 | * | 1/2001  | Cheng et al. .................. 361/752 |
| 6,226,189 | B1 | * | 5/2001  | Haffenden et al. ........... 361/814 |
| 6,244,894 | B1 | * | 6/2001  | Miyashita ..................... 439/500 |
| 6,343,018 | B1 | * | 1/2002  | Takeyama et al. ............ 361/737 |
| 6,421,246 | B1 | * | 7/2002  | Schremmer ................... 361/737 |
| 6,424,118 | B1 | * | 7/2002  | Tu ................................. 320/115 |
| 6,455,188 | B1 | * | 9/2002  | McKay et al. .................. 429/97 |
| 6,543,696 | B2 | * | 4/2003  | Nishimura ............... 235/472.01 |
| 6,561,851 | B2 | * | 5/2003  | Florescu ....................... 439/630 |
| 6,563,715 | B2 | * | 5/2003  | Villain et al. ................. 361/800 |
| 6,602,096 | B1 | * | 8/2003  | Kronestedt et al. ........... 439/630 |
| 6,724,618 | B1 | * | 4/2004  | Jenkins et al. ............ 361/679.32 |
| 6,761,566 | B2 | * | 7/2004  | Chin-Lung et al. .......... 439/76.1 |
| 6,761,591 | B1 | * | 7/2004  | Zhou ............................. 439/630 |
| 6,766,952 | B2 | * | 7/2004  | Luu ............................... 235/451 |
| 6,805,570 | B1 | * | 10/2004 | Lee ................................ 439/326 |

(Continued)

*Primary Examiner* — Ross Gushi
(74) *Attorney, Agent, or Firm* — Novak Druce Connolly Bove + Quigg LLP

(57) ABSTRACT

A chip card holder includes a latching member and a housing. The latching member includes a first cover portion, a second cover portion and a connecting portion therebetween the first cover portion and the second cover portion. The housing defines two receiving grooves. The first cover portion and the second cover portion respectively protrude from the two receiving grooves. The receiving grooves with the first cover portion and the second cover portion define a first latching space and a second latching space for receiving two chip cards.

15 Claims, 7 Drawing Sheets

(56) References Cited

U.S. PATENT DOCUMENTS

| | | | | |
|---|---|---|---|---|
| 6,831,977 B2* | 12/2004 | Kiernan et al. | 379/433.09 |
| 6,876,552 B2* | 4/2005 | Pan et al. | 361/730 |
| 6,888,724 B2* | 5/2005 | Shaie | 361/719 |
| 6,892,078 B2* | 5/2005 | Sakaguchi et al. | 455/558 |
| 6,947,767 B2* | 9/2005 | Haga et al. | 455/558 |
| 6,951,470 B1* | 10/2005 | Huang | 439/159 |
| 6,969,282 B2* | 11/2005 | Liu | 439/630 |
| 7,093,764 B1* | 8/2006 | Valenzuela et al. | 235/486 |
| 7,097,511 B1* | 8/2006 | Chen et al. | 439/630 |
| 7,131,871 B1* | 11/2006 | Zuo et al. | 439/630 |
| 7,149,307 B2* | 12/2006 | Puharinen et al. | 379/445 |
| 7,160,131 B1* | 1/2007 | Zuo et al. | 439/331 |
| 7,238,038 B2* | 7/2007 | Kumagai | 439/326 |
| 7,244,135 B2* | 7/2007 | Chen et al. | 439/327 |
| 7,252,529 B2* | 8/2007 | Yang et al. | 439/327 |
| 7,264,495 B2* | 9/2007 | Zuo et al. | 439/326 |
| 7,280,846 B2* | 10/2007 | Lin | 455/558 |
| 7,306,491 B1* | 12/2007 | Wei et al. | 439/630 |
| 7,344,401 B2* | 3/2008 | Zuo et al. | 439/326 |
| 7,354,290 B2* | 4/2008 | Zhan et al. | 439/326 |
| 7,363,068 B2* | 4/2008 | Ku | 455/575.4 |
| 7,371,088 B2* | 5/2008 | Chen et al. | 439/159 |
| 7,407,414 B2* | 8/2008 | Zuo et al. | 439/630 |
| 7,445,510 B2* | 11/2008 | Feng et al. | 439/630 |
| 7,447,522 B2* | 11/2008 | Kumazawa et al. | 455/558 |
| 7,458,857 B2* | 12/2008 | Lin et al. | 439/630 |
| 7,494,360 B2* | 2/2009 | Zhan et al. | 439/326 |
| 7,515,438 B2* | 4/2009 | Lippert et al. | 361/814 |
| 7,520,766 B2* | 4/2009 | Tsai | 439/159 |
| 7,583,514 B2* | 9/2009 | Zuo et al. | 361/801 |
| 7,589,977 B2* | 9/2009 | Lin | 361/816 |
| 7,634,297 B2* | 12/2009 | Sin | 455/558 |
| 7,666,017 B2* | 2/2010 | Chen et al. | 439/326 |
| 7,670,185 B2* | 3/2010 | Zhang et al. | 439/630 |
| 7,672,691 B2* | 3/2010 | Kim et al. | 455/558 |
| 7,682,178 B2* | 3/2010 | Feng | 439/326 |
| 7,744,000 B2* | 6/2010 | Yang et al. | 235/486 |
| 7,762,827 B2* | 7/2010 | Liu | 439/331 |
| 7,762,850 B2* | 7/2010 | Tang | 439/630 |
| 7,775,836 B2* | 8/2010 | Lu et al. | 439/630 |
| 7,780,090 B2* | 8/2010 | Long et al. | 235/486 |
| 7,794,250 B2* | 9/2010 | Imamura | 439/159 |
| 7,798,858 B1* | 9/2010 | Zuo | 439/630 |
| 7,823,790 B1* | 11/2010 | Valenzuela et al. | 235/486 |
| 7,837,092 B2* | 11/2010 | Wen | 235/375 |
| 7,837,486 B2* | 11/2010 | Li | 439/159 |
| 7,837,487 B2* | 11/2010 | Zuo | 439/159 |
| 7,889,506 B2* | 2/2011 | Huang | 361/737 |
| 7,916,488 B2* | 3/2011 | Chang | 361/737 |
| 7,950,945 B2* | 5/2011 | Ahn | 439/325 |
| 7,955,135 B2* | 6/2011 | Wang et al. | 439/630 |
| 8,005,509 B2* | 8/2011 | Huang et al. | 455/558 |
| 8,023,285 B2* | 9/2011 | Zhu | 361/810 |
| 8,059,419 B2* | 11/2011 | Lu | 361/759 |
| 8,078,226 B2* | 12/2011 | Lo et al. | 455/558 |
| 8,107,258 B2* | 1/2012 | Chang | 361/801 |
| 8,154,878 B2* | 4/2012 | Wang et al. | 361/754 |
| 8,200,282 B2* | 6/2012 | Liang et al. | 455/558 |
| 8,215,558 B2* | 7/2012 | Valenzuela et al. | 235/486 |
| 8,223,502 B2* | 7/2012 | Shen et al. | 361/748 |
| 8,233,949 B2* | 7/2012 | Li et al. | 455/575.4 |
| 8,247,109 B2* | 8/2012 | Zuo et al. | 429/163 |
| 8,248,819 B2* | 8/2012 | Wang | 361/802 |
| 8,254,135 B2* | 8/2012 | Shen et al. | 361/737 |
| 8,280,441 B2* | 10/2012 | Lo et al. | 455/558 |
| 8,391,024 B2* | 3/2013 | Yang | 361/818 |
| 8,391,922 B2* | 3/2013 | Lee | 455/558 |
| 8,462,512 B2* | 6/2013 | Zhang | 361/737 |
| 8,462,514 B2* | 6/2013 | Myers et al. | 361/754 |
| 8,564,486 B2* | 10/2013 | Wang et al. | 343/702 |
| 8,746,573 B2* | 6/2014 | Zhu et al. | 235/486 |
| 8,801,468 B2* | 8/2014 | Gao | 439/630 |
| 8,808,021 B2* | 8/2014 | Liu et al. | 439/331 |
| 2002/0036896 A1* | 3/2002 | Matsumoto | 361/752 |
| 2002/0094841 A1* | 7/2002 | Sakaguchi et al. | 455/558 |
| 2002/0118826 A1* | 8/2002 | Kiernan et al. | 379/433.09 |
| 2003/0119364 A1* | 6/2003 | Liu | 439/630 |
| 2003/0134602 A1* | 7/2003 | Haga et al. | 455/90 |
| 2003/0195020 A1* | 10/2003 | Kubo | 455/575.1 |
| 2003/0227763 A1* | 12/2003 | Kao et al. | 361/818 |
| 2004/0127101 A1* | 7/2004 | Zhou | 439/630 |
| 2004/0190265 A1* | 9/2004 | Shaie | 361/719 |
| 2005/0106925 A1* | 5/2005 | Liu | 439/366 |
| 2005/0208814 A1* | 9/2005 | Tsai et al. | 439/326 |
| 2005/0255753 A1* | 11/2005 | Buschmann | 439/630 |
| 2006/0281356 A1* | 12/2006 | Zuo et al. | 439/325 |
| 2007/0001698 A1* | 1/2007 | Chen et al. | 324/763 |
| 2007/0021010 A1* | 1/2007 | Chen et al. | 439/630 |
| 2007/0087600 A1* | 4/2007 | Chen et al. | 439/159 |
| 2007/0128913 A1* | 6/2007 | Zuo et al. | 439/325 |
| 2007/0128914 A1* | 6/2007 | Yang et al. | 439/326 |
| 2007/0141878 A1* | 6/2007 | Van der Steen et al. | 439/159 |
| 2007/0149059 A1* | 6/2007 | Zuo et al. | 439/630 |
| 2007/0167080 A1* | 7/2007 | Chen et al. | 439/630 |
| 2007/0224871 A1* | 9/2007 | Zhan et al. | 439/327 |
| 2007/0293092 A1* | 12/2007 | Seo | 439/630 |
| 2009/0035977 A1* | 2/2009 | Chen et al. | 439/326 |
| 2009/0241303 A1* | 10/2009 | Zhu | 24/591.1 |
| 2009/0267677 A1* | 10/2009 | Myers et al. | 327/356 |
| 2009/0269944 A1* | 10/2009 | Gao et al. | 439/59 |
| 2009/0280670 A1* | 11/2009 | Feng | 439/326 |
| 2010/0033939 A1* | 2/2010 | Liu | 361/759 |
| 2010/0055948 A1* | 3/2010 | Zuo | 439/152 |
| 2010/0087080 A1* | 4/2010 | Li et al. | 439/327 |
| 2010/0093235 A1* | 4/2010 | Huang | 439/892 |
| 2010/0112838 A1* | 5/2010 | Liu | 439/133 |
| 2010/0136816 A1* | 6/2010 | Ahn | 439/331 |
| 2010/0234070 A1* | 9/2010 | Li et al. | 455/558 |
| 2010/0248550 A1* | 9/2010 | Zuo | 439/630 |
| 2010/0259906 A1* | 10/2010 | Chang | 361/759 |
| 2010/0279552 A1* | 11/2010 | Zhu et al. | 439/630 |
| 2010/0297886 A1* | 11/2010 | Lai | 439/630 |
| 2011/0003496 A1* | 1/2011 | Hu | 439/159 |
| 2011/0034050 A1* | 2/2011 | Zhu et al. | 439/159 |
| 2011/0039433 A1* | 2/2011 | Tsai | 439/159 |
| 2011/0051391 A1* | 3/2011 | Wei et al. | 361/818 |
| 2011/0070760 A1* | 3/2011 | Zhang | 439/159 |
| 2012/0094514 A1* | 4/2012 | Sun et al. | 439/159 |
| 2013/0115796 A1* | 5/2013 | Liu et al. | 439/325 |
| 2014/0038445 A1* | 2/2014 | Zhang et al. | 439/345 |

* cited by examiner

CHIP CARD HOLDER FOR ELECTRONIC DEVICE

BACKGROUND

1. Technical Field

The present disclosure generally relates to card use in electronic devices, and particularly to a chip card holder for an electronic device.

2. Description of Related Art

With the development of wireless communication and information processing technologies, portable electronic devices such as mobile phones are widely used. Chip cards having special circuits are used in portable electronic devices to enhance or add to the functions of the portable electronic devices. For example, a subscriber identity module (SIM) card can be placed in a mobile phone to dedicate the mobile phone's functions to the SIM card owner. By changing SIM cards, a single mobile phone can be used by many different SIM card owners as a personal phone.

According to various requirements, users may need to use two different chip cards (such as SIM cards, memory cards) in an electronic device. However, a typical dual card securing mechanism needs two separate seats. The seats not only take up too much space of the electronic device, but also take more costs.

Therefore, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the chip card holder. Moreover, in the drawings, like reference numerals designate corresponding parts throughout the several views.

DETAILED DESCRIPTION

The disclosed surface contact card holder can seat chip cards such as SIM cards, compact flash cards (CFs) and multimedia cards (MMCs), for example. The disclosed electronic device in the exemplary embodiment is a mobile phone and can alternatively be a PDA, camera, recorder, or other devices, while remaining well within the scope of the disclosure.

Figure 1:
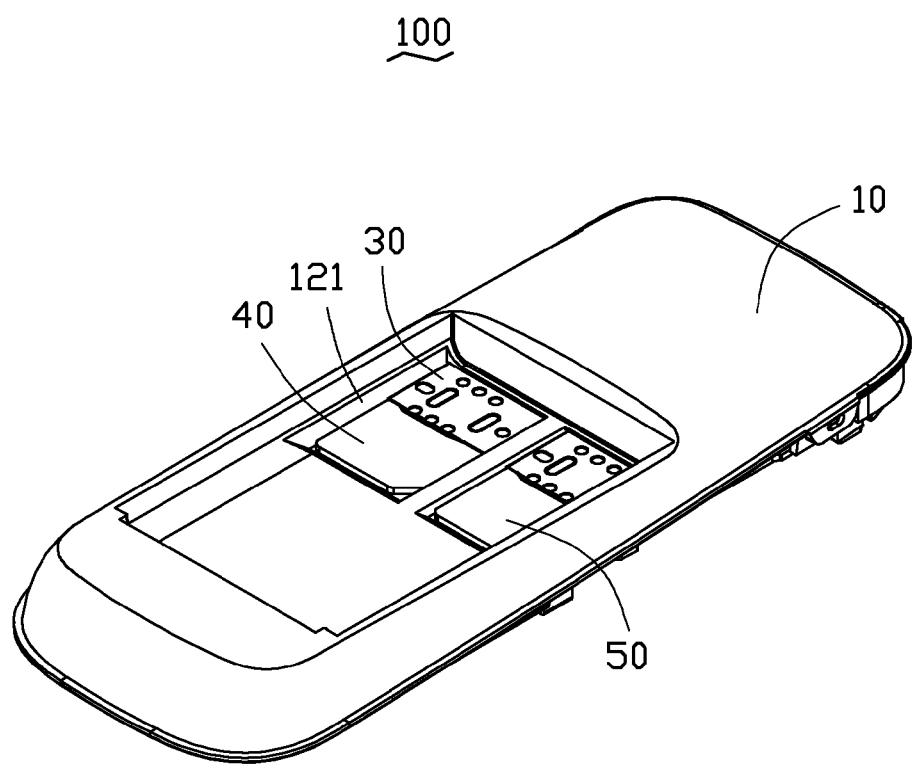
FIG. 1 is an isometric view of a chip card holder in accordance with an exemplary embodiment.
Figure 2:
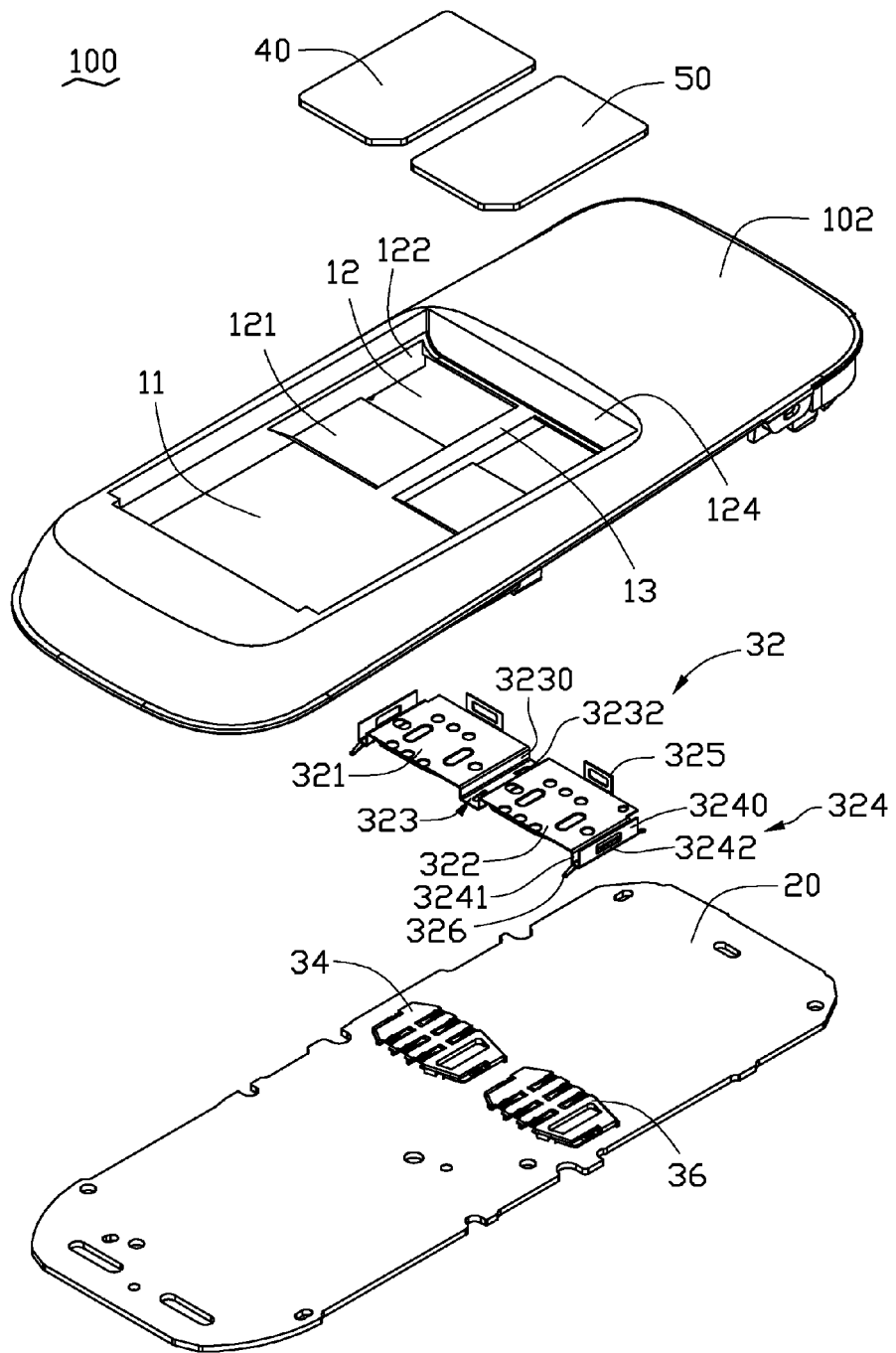
FIG. 2 is an exploded view of one embodiment of the chip card holder.

FIGS. 1 and 2 show a chip card holder 30 mounted on an electronic device 100. The electronic device 100 comprises a housing 10 and a printed circuit board 20. The chip card holder 30 is assembled on the housing 10 to receive two chip cards 40, 50.

Figure 3:
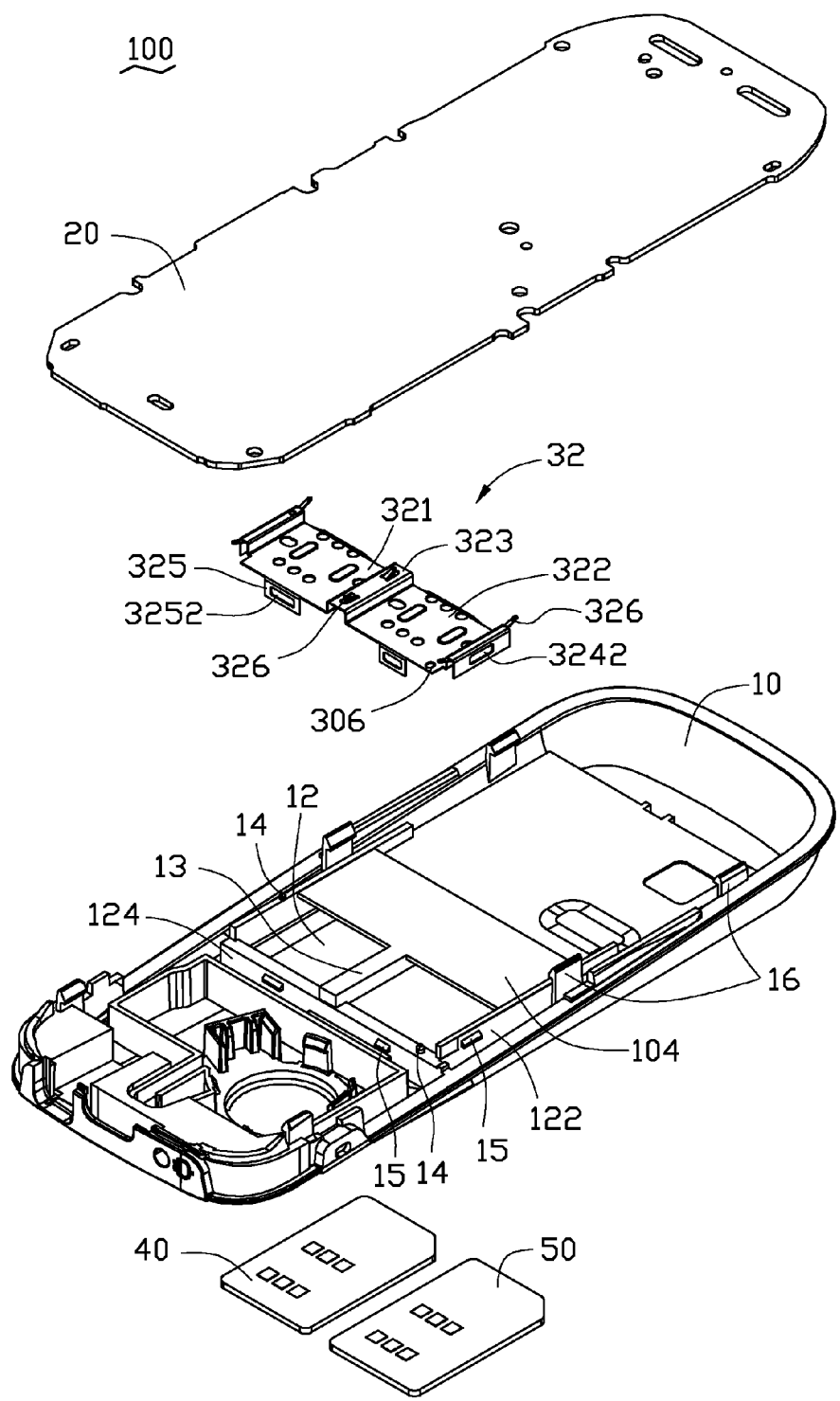
FIG. 3 is similar to FIG. 1, but viewed from anther aspect.

FIGS. 2 and 3 show that the housing 10 has a first surface 102 and a second surface 104 opposite to each other. The first surface 102 defines a battery receiving cavity 11 for receiving a battery. A bottom surface of the battery receiving cavity 11 defines two receiving grooves 121. The two receiving grooves 121 are spaced by a beam 13. Each receiving groove 121 defines a through hole 12. The housing 10 has two opposite sidewalls 122 and an end wall 124 connected to and located between the two opposite sidewalls 122. Each sidewall 122 is adjacent to a corresponding receiving groove 121. The end wall 124 is positioned at one end of the two receiving grooves 121 and is connected to the beam 13. A plurality of projections 15 extend from each sidewall 122 and the end wall 124 at the second surface 104 of the housing 10. In this exemplary embodiment, each sidewall 122 has one projection 15, and the end wall 124 has two projections 15. A plurality of posts 14 protrude from the end wall 124 and one of the sidewalls 122. In this exemplary embodiment, a top surface of the end wall 124 has one post 14 adjacent to one of the sidewalls 122, and a top surface of the other sidewall 122 has one post 14. Two hooks 16 extend from the second surface 104 configured for being engaged with the printed circuit board 20.

The chip card holder 30 comprises a latching member 32, a first connector 34 and a second connector 36. The latching member 32 is made of metal and has a first cover portion 321, a second cover portion 322, and a connecting portion 323 connected between the first cover portion 321 and the second cover portion 322. Two latching side plates 324 extend from opposite sides of the first cover portion 312 and the second cover portion 322. One end of each first cover portion 321 and the second cover portion 322 has a latching end plate 325. Each latching end plate 325 defines a latching hole 3252. The connecting portion 323 is substantially U-shaped and has two vertical portions 3230 and a horizontal portion 3232. Each vertical portion 3230 is perpendicularly connected to the first cover portion 321 or the second cover portion 322. The horizontal portion 3232 defines at least one hole 3261 and an elastic finger 326 extending from the hole 3261. Each latching side plate 324 is substantially U-shaped and has opposite elastic finger 326 extending from a bottom edge 3241 of the U-shaped. Each latching side plate 324 defines a latching hole 3242 at one side edge 3240. The latching member 32 has two retaining holes 306. One of the retaining holes 306 is defined in the second cover portion 322, and the other retaining hole 306 is defined in one of the latching side plate 324.

The printed circuit board 20 is positioned at another side of the housing 10. The first connector 34 and the second connector 36 are located on the printed circuit board 20, for electronically connecting the chip cards 40, 50.

Figure 4:
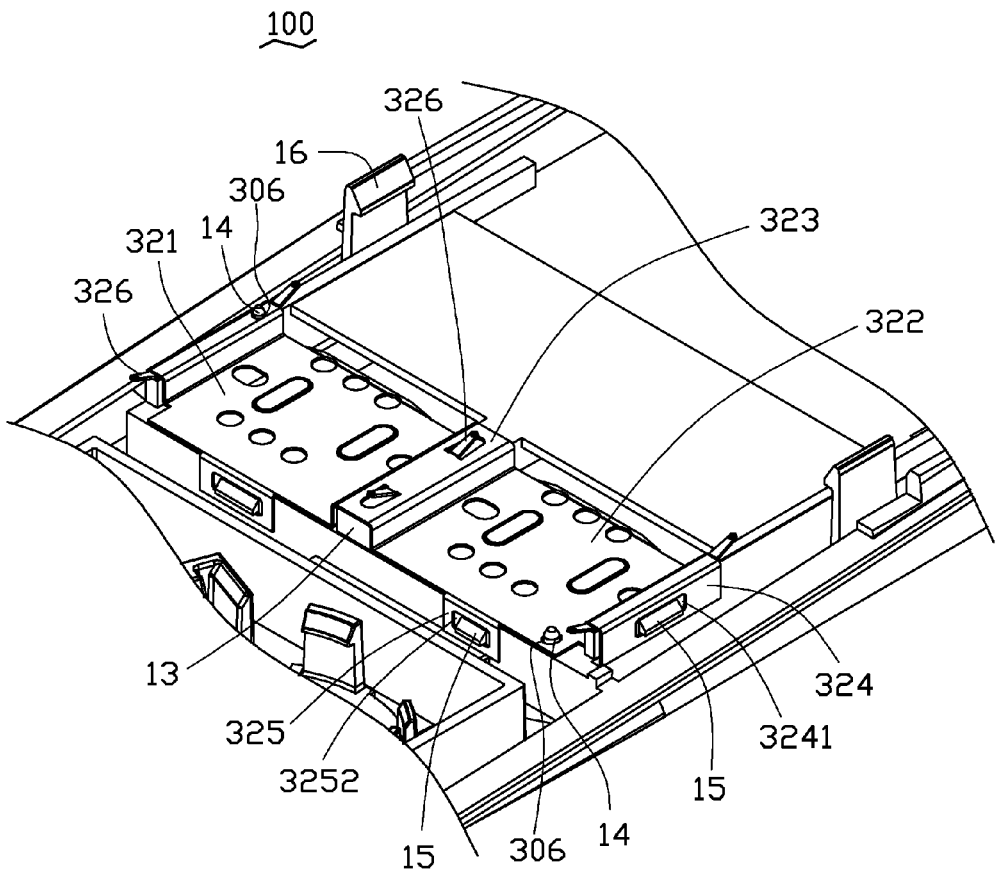
FIG. 4 is a partially enlarge assembled view of the chip card holder.
Figure 5:
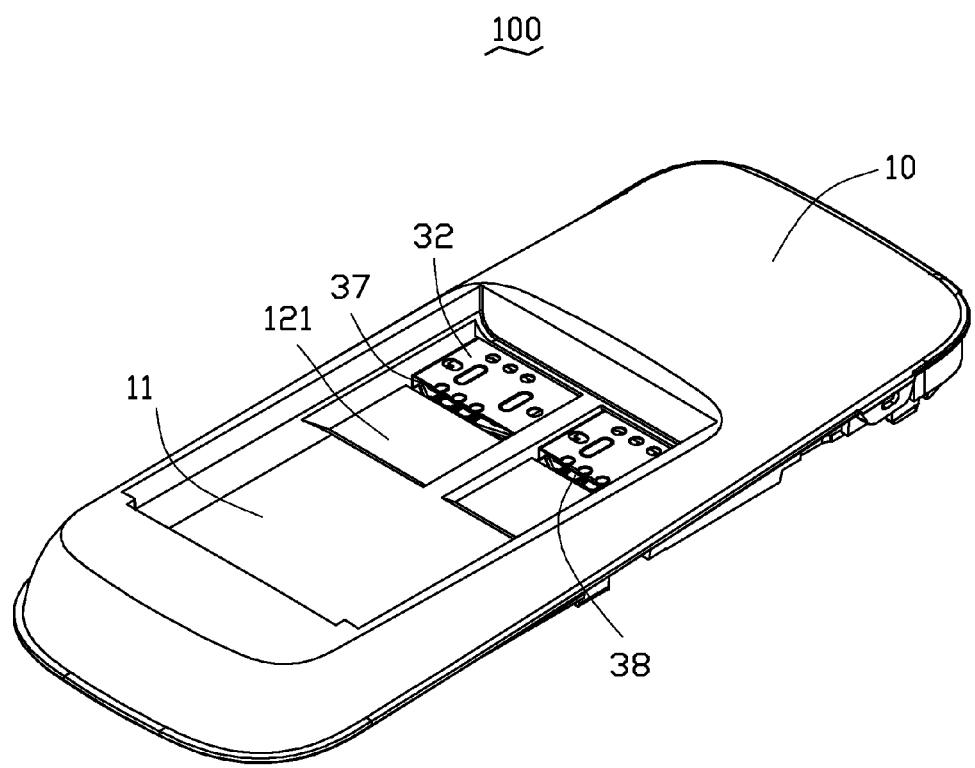
FIG. 5 is an assembling view of the chip card holder without the chip cards.
Figure 6:
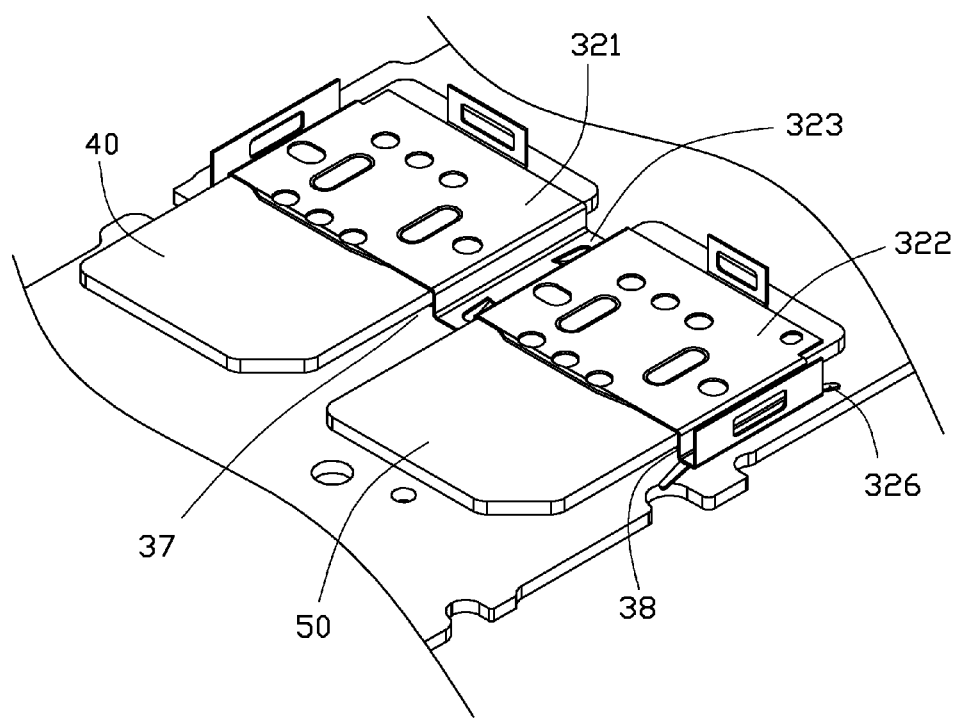
FIG. 6 is a partially enlarge assembled view of the chip card holder.

FIGS. 4 to 6 show that the latching member 32 is positioned in the second surface 104 of the housing 10. The posts 14 are latched into the retaining holes 306 of the latching member 32, and the connecting portion 323 clamps the beam 13. The projections 15 extend through the latching holes 3252 of the latching end plate 325 and the latching holes 3241 of the latching side plates 324. Thus, the latching side plates 324 are latched to the sidewalls 122, and the latching end plates 325 are latched to the end wall 124. The first cover portion 321 and the second cover portion 322 respectively protrude from the holes 12. A height of the first cover portion 321 and the second cover portion 322 is higher than a bottom surface of the receiving groove 121. Thus, the chip card can be inserted under the first cover portion 321 and the second cover portion 322 from the receiving grooves 121. The printed circuited board 20 is positioned at another side of the housing 10. The first connector 34 faces the first cover portion 321 and defines a first latching space 37. The second connector 36 faces the second cover portion 322 and defines a second latching space 38. The elastic fingers 326 are electronically connected to the printed circuit board 20 for grounding.

Figure 7:
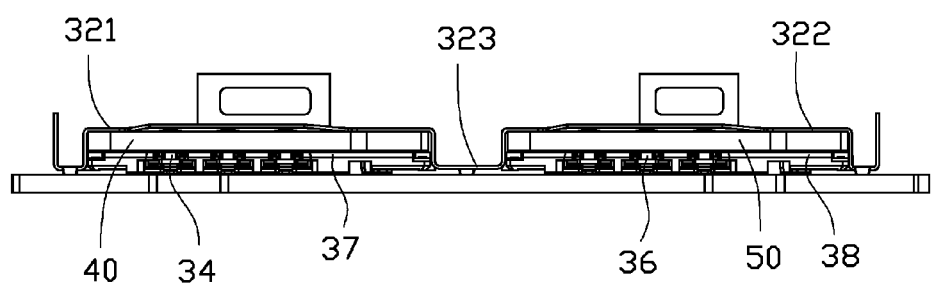
FIG. 7 is a cross sectional view of the card holder showing the two chip cards in position on the chip card holder.

FIGS. 6 and 7 show that in use the surface contact cards 40 and 50 are respectively inserted into the first latching space 37 and the second latching space 38 from the receiving grooves 121. The first connector 34 is electronically connected to the chip card 40, and the second connector 36 is electronically connected to the chip card 50.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip card holder, comprising:
   a latching member comprising a first cover portion, a second cover portion, and a connecting portion therebetween the first cover portion and the second cover portion; and
   a housing defining two receiving grooves, and the first cover portion and the second cover portion respectively protruding from the two receiving grooves;
   wherein the two receiving grooves, with the first cover portion and the second cover portion, define a first latching space and a second latching space for receiving two chip cards.

2. The chip card holder as claimed in claim 1, wherein the two receiving grooves are spaced by a beam, the housing comprises two opposite sidewalls and an end wall connected between the two opposite sidewalls, each sidewall is adjacent to a corresponding receiving groove, the end wall is positioned at one end of the two receiving grooves and is connected to the beam, and the connecting portion is latched on the beam.

3. The chip card holder as claimed in claim 2, wherein two latching side plates extend from opposite sides of the first cover portion and the second cover portion, and the two latching side plates are latched on the two opposite sidewalls.

4. The chip card holder as claimed in claim 3, wherein one end of each of the first cover portion and the second cover portion has a latching end plate, and the latching end plates are latched on the end wall.

5. The chip card holder as claimed in claim 4, wherein each latching side plate is substantially U-shaped and has opposite elastic finger extending from a bottom edge of the U-shaped, and each latching side plate, at one side edge, and each latching end plate define a latching hole.

6. The chip card holder as claimed in claim 5, wherein a plurality of projections extend from each sidewall and the end wall, and the plurality of projections are latched in the latching holes of the latching side plates and the latching end plates of the latching member.

7. The chip card holder as claimed in claim 5, wherein a plurality of posts protrude from the end wall and one of the sidewalls, the second cover portion and one of the two latching side plate define a plurality of retaining holes for latching the plurality of posts.

8. The chip card holder as claimed in claim 1, wherein the connecting portion is substantially U-shaped and comprises two vertical portions and a horizontal portion, the two vertical portions are respectively perpendicularly extend from the first cover portion and the second cover portion, and the horizontal portion defines at least one hole and an elastic finger extending from the at least one hole.

9. A portable electronic device comprising:
   a housing defining two receiving grooves spaced by a beam,
   a latching member comprising a first cover portion, a second cover portion and a connecting portion therebetween the first cover portion and the second cover portion, the first cover portion and the second cover portion respectively protruding from the two receiving grooves, and the connecting portion latched on the beam;
   wherein the two receiving grooves, with the first cover portion and the second cover portion, define a first latching space and a second latching space for receiving two chip cards.

10. The portable electronic device as claimed in claim 9, wherein the housing comprises two opposite sidewalls and an end wall connected between the two opposite sidewalls, each sidewall is adjacent to a corresponding receiving groove, and the end wall is positioned at one end of the two receiving grooves and is connected to the beam.

11. The portable electronic device as claimed in claim 10, wherein the connecting portion is substantially U-shaped and comprises two vertical portions and a horizontal portion, each vertical portion is perpendicularly connected to the first cover portion or the second cover portion, and the horizontal portion defines at least one hole and an elastic finger extending from the at least one hole.

12. The portable electronic device as claimed in claim 10, wherein two latching side plates extend from opposite sides of the first cover portion and the second cover portion, each latching side plate is substantially U-shaped, and has opposite elastic fingers extending from a bottom edge of the U-shaped, and the two latching side plates are latched on the two opposite sidewalls.

13. The portable electronic device as claimed in claim 12, wherein one end of each of the first cover portion and the second cover portion has a latching end plate, and the latching end plates are latched on the end wall.

14. The portable electronic device as claimed in claim 13, wherein each latching side plate defines at one side edge and each latching end plate define a latching hole, a plurality of projections extend from each sidewall and the end wall, and the plurality of projections are latched in the latching holes of the latching side plates and the latching end plates of the latching member.

15. The portable electronic device as claimed in claim 14, wherein a plurality of posts protrude from the end wall and one of the sidewalls, the second cover portion and one of the two latching side plate define a plurality of retaining holes for latching the plurality of posts.

* * * * *